US012550599B2

(12) United States Patent
Kong et al.

(10) Patent No.: US 12,550,599 B2
(45) Date of Patent: Feb. 10, 2026

(54) DISPLAY DEVICE

(71) Applicant: LG DISPLAY CO., LTD., Seoul (KR)

(72) Inventors: InYeong Kong, Seoul (KR); JaeHyung Jo, Goyang-si (KR)

(73) Assignee: LG Display Co., Ltd (KR)

(*) Notice: Subject to any disclaimer, the term of this patent is extended or adjusted under 35 U.S.C. 154(b) by 481 days.

(21) Appl. No.: 17/976,771

(22) Filed: Oct. 29, 2022

(65) Prior Publication Data

US 2023/0217796 A1 Jul. 6, 2023

(30) Foreign Application Priority Data

Dec. 31, 2021 (KR) .................. 10-2021-0194560

(51) Int. Cl.
*H10K 59/88* (2023.01)
*H10K 59/126* (2023.01)
*H10K 59/131* (2023.01)

(52) U.S. Cl.
CPC ........... *H10K 59/88* (2023.02); *H10K 59/126* (2023.02); *H10K 59/131* (2023.02)

(58) Field of Classification Search
None
See application file for complete search history.

(56) References Cited

U.S. PATENT DOCUMENTS

| 2004/0135173 A1* | 7/2004 | Choi | H10K 59/131 257/E27.111 |
| 2010/0265424 A1* | 10/2010 | Chiu | G02F 1/136259 349/54 |
| 2011/0122344 A1* | 5/2011 | Matsumuro | H10K 59/131 438/34 |
| 2012/0229438 A1* | 9/2012 | Fujita | G09G 3/3266 345/211 |
| 2018/0061899 A1* | 3/2018 | Oh | H10K 59/8731 |
| 2021/0202659 A1* | 7/2021 | Lee | H10K 71/60 |

FOREIGN PATENT DOCUMENTS

| KR | 10-2018-0062516 A | 6/2018 |
| KR | 20210086441 A | 7/2021 |

OTHER PUBLICATIONS

Office Action in Korean Appln. No. 10-2021-0194560, mailed on Oct. 28, 2025, 11 pages (with English translation).

* cited by examiner

*Primary Examiner* — Bilkis Jahan
(74) *Attorney, Agent, or Firm* — Fish & Richardson P.C.

(57) ABSTRACT

A display device includes a substrate having a plurality of sub-pixels defined thereon, each of the plurality of sub-pixels including an emission area and a non-emission area, the display device further includes at least one gate line disposed in the non-emission area and extended in one direction, the display device further includes at least one signal line disposed in the non-emission area and crossing the at least one gate line, the display device further includes at least one branch line connected to the at least one signal line, the display device further includes at least one bridge line branching off from a metal layer disposed adjacent to the at least one branch line, the at least one branch line overlaps with the at least one bridge line.

13 Claims, 9 Drawing Sheets

DISPLAY DEVICE

CROSS-REFERENCE TO RELATED APPLICATION

This application claims the priority of Korean Patent Application No. 10-2021-0194560 filed on Dec. 31, 2021, which is hereby incorporated by reference in its entirety as if fully set forth herein.

BACKGROUND

Field of the Disclosure

The present disclosure relates to a display device, and more particularly to a display device that can conduct repair stably while achieving a high aperture ratio.

Description of the Background

As the era of information technology has begun, the field of display devices that represent electrical information signals graphically has been rapidly grown up. In accordance with this, various display devices which are thinner, lighter and consume less power have been developed.

Examples of display devices may include a liquid-crystal display device (LCD), a field emission display device (FED), an electro-wetting display device (EWD), and an organic light-emitting display device (OLED), etc.

Among these, an OLED device is capable of producing light in its own and thus does not require any additional light source, unlike a liquid-crystal display (LCD) device. Therefore, an OLED device can be made lighter and thinner than an LCD device. In addition, an organic light-emitting display device has advantages in that it is driven with low voltage to consume less power, and in that it represents vivid colors and has short response time, wide viewing angle and good contrast ratio (CR). For these reasons, a field emission display device finds more and more applications.

An organic light-emitting emitting display device is implemented by disposing an emissive layer using an organic material between two electrodes, i.e., as an anode and a cathode. Holes in the anode are injected into the emissive layer, and electrons in the cathode are injected into the emissive layer, such that the electrons and the holes are recombined to form excitons in the emissive layer, and light is emitted therefrom.

SUMMARY

In view of the above, the present disclosure is to provide a display device in which a branch line is made of a transparent material so that the aperture ratio can be improved.

The present disclosure is also to provide a display device that allows a repair process without disposing any additional metal layer on a branch line.

The present disclosure is not limited to the above-mentioned and other features, which are not mentioned above, can be clearly understood by those skilled in the art from the following descriptions.

In an aspect of the present disclosure, a display device includes a substrate having a plurality of sub-pixels defined thereon, each of the plurality of sub-pixels including an emission area and a non-emission area, at least one gate line disposed in the non-emission area and extended in one direction; at least one signal line disposed in the non-emission area and crossing the at least one gate line; at least one branch line connected to the at least one signal line, and at least one bridge line branching off from a metal layer disposed adjacent to the at least one branch line. The at least one branch line overlaps with the at least one bridge line.

Other detailed matters of the exemplary aspects are included in the detailed description and the drawings.

According to an exemplary aspect of the present disclosure, a branch line extended from a signal line includes a semiconductor layer and a transparent oxide layer, so that it has transparency and thus a larger open area can be achieved.

According to an exemplary aspect of the present disclosure, no additional opaque metal layer for conducting a repair process for a signal line is required, so that the aperture ratio can be increased.

According to an exemplary aspect of the present disclosure, a repair process for a signal line can be carried out stably while achieving a high aperture ratio.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain various principles.

In the drawings.

DETAILED DESCRIPTION

Figure 1:
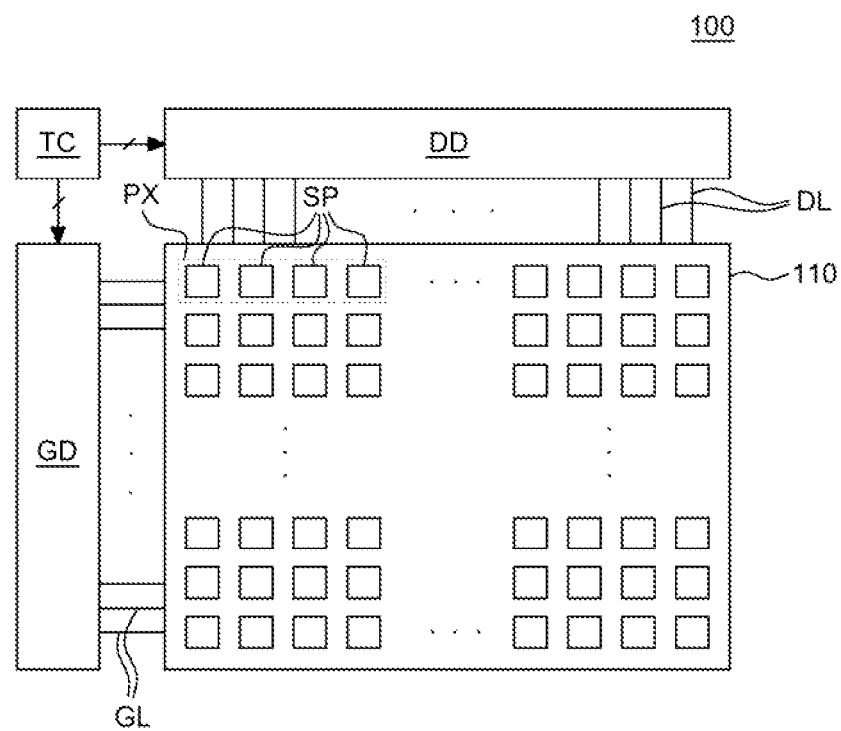
FIG. 1 is a block diagram of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Herein, transistors used in a display device may be implemented as one or more of n-channel transistors (NMOS) and p-channel transistors (PMOS). The transistors may be implemented as an oxide semiconductor transistor having an oxide semiconductor as an active layer or an LTPS transistor having a low-temperature poly-silicon (LTPS) as an active layer. Each of the transistors may include at least a gate electrode, a source electrode and a drain electrode. The transistors may be implemented as thin-film transistors (TFT) on the display panel. In the transistors, the carriers flow from the source electrode to the drain electrode. For an n-channel transistor (NMOS) where electrons are the carriers, the voltage at the source electrode is lower than the voltage at the drain electrode to allow the electrons to flow from the source electrode to the drain electrode. In an n-channel transistor NMOS, electric current flows from the drain electrode to the source electrode, and the source electrode may be an output terminal. For a p-channel transistor (PMOS) where holes are the carriers, the voltage at the source electrode is higher than the voltage at the drain electrode to allow the holes to flow from the source electrode to the drain electrode. In a p-channel transistor PMOS, as holes flow from the source electrode to the drain electrode, electric current flows from the source to the drain, and the drain electrode may be an output terminal. As such, it is to be noted that the source and drain of a transistor are not fixed but may be switched depending on the applied voltage. Herein, it is assumed that transistors are n-channel transistors (NMOS), but the present disclosure is not limited thereto. P-channel transistors may be employed and the circuit configuration may be altered accordingly.

For transistors used as switching elements, a gate signal swings between a gate-on voltage and a gate-off voltage. The gate-on voltage is set to a voltage higher than the threshold voltage Vth of a transistor, while the gate-off voltage is set to a voltage lower than the threshold voltage Vth of the transistor. The transistor is turned on in response to the gate-on voltage and is turned off in response to the gate-off voltage. For a NMOS transistor, the gate-on voltage may be a gate-high voltage (VGH), and the gate-off voltage may be a gate-low voltage (VGL). For a PMOS transistor, the gate-on voltage may be a gate-low voltage (VGL), and the gate-off voltage may be a gate-high voltage (VGH).

Hereinafter, exemplary aspects of the present disclosure will be described in detail with reference to the accompanying drawings.

FIG. 1 is a block diagram of a display device according to an exemplary aspect of the present disclosure. Referring to FIG. 1, a display device 100 includes a display panel 110, a gate driver GD, a data driver DD, and a timing controller TC.

The display panel 110 is a panel for displaying images. The display panel 110 may include a variety of circuits, lines, and light-emitting elements disposed on a substrate. The display panel 110 may include a plurality of pixels, each of which is defined by a plurality of data lines DL and a plurality of gate lines GL intersecting one another and is connected to the data lines DL and the gate lines GL. The display panel 110 may include a display area defined by the plurality of pixels PX and a non-display area where various signal lines, pads, etc. are formed. The display panel 110 may be implemented as a display panel used in various display devices such as a liquid-crystal display device, an organic light-emitting display device and an electrophoretic display device. In the following description, the display panel 110 is described as a panel used in an organic light-emitting display device. It is, however, to be understood that the present disclosure is not limited thereto.

The timing controller TC receives timing signals such as a vertical synchronization signal, a horizontal synchronization signal, a data enable signal and a dot clock via a receiving circuit such as LVDS and TMDS interfaces connected to a host system. The timing controller TC generates timing control signals for controlling the data driver DD and the gate driver GD based on the received timing signals.

The data driver DD supplies data voltage to a plurality of sub-pixels SP. The data driver DD may include a plurality of source drive integrated circuits (ICs). The plurality of source drive ICs may receive digital video data and a source timing control signal from the timing controller TC. The source drive ICs may convert the digital video data items into a gamma voltage in response to a source timing control signal to generate a data voltage DATA, and may apply the data voltage via the data lines DL of the display panel 110. The source drive ICs may be connected to the data lines DL of the display panel 110 by a chip-on-glass (COG) process or a tape automated bonding (TAB) process. In addition, the source drive ICs may be formed on the display panel 110 or may be formed on a separate PCB and connected to the display panel 110.

The gate driver GD supplies gate signals to the sub-pixels SP. The gate driver GD may include a level shifter and a shift register. The level shifter may shift the level of a clock signal input at a transistor-transistor-logic (TTL) level from the timing controller TC and then may supply it to the shift register. The shift register may be formed in, but is not limited to, the non-display area of the display panel 110 by using a GIP technique. The shift register may include a plurality of stages for shifting gate signals to output them in response to the clock signal and the driving signal. The plurality of stages included in the shift register may sequentially output gate signals through the plurality of output terminals.

The display panel 110 may include a plurality of sub-pixels SP. The plurality of sub-pixels SP may emit different colors. For example, each of the plurality of sub-pixels SP may include, but is not limited to, a red sub-pixel, a green sub-pixel, a blue sub-pixel and a white sub-pixel. Such sub-pixels SP may form pixels PX. Specifically, a red sub-pixel, a green sub-pixel, a blue sub-pixel and a white sub-pixel may form one pixel PX, and the display panel 110 may include a plurality of pixels PX.

Hereinafter, a driver circuit for driving a single sub-pixel SP will be described in detail with reference to FIG. 2.

Figure 2:
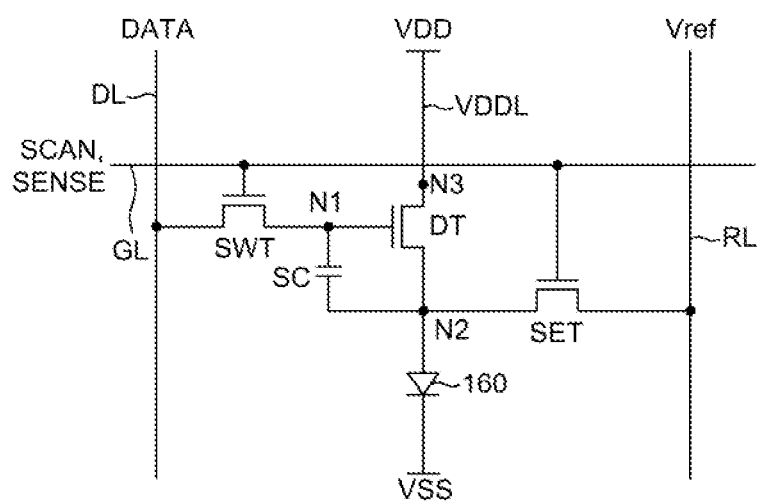
FIG. 2 is a circuit diagram of a sub-pixel of a display device according to an exemplary aspect of the present disclosure.

FIG. 2 is a circuit diagram of a sub-pixel of a display device according to an exemplary aspect of the present disclosure. FIG. 2 shows a circuit diagram of one of a plurality of sub-pixels SP of the display device 100.

Referring to FIG. 2, the sub-pixel SP may include a switching transistor SWT, a sensing transistor SET, a driving transistor DT, a storage capacitor SC, and a light-emitting element 160.

The light-emitting element 160 may include an anode, an organic layer, and a cathode. The organic layer may further include a variety of organic layers such as a hole injection layer, a hole transport layer, an organic emissive layer, an electron transport layer, and an electron injection layer. The anode of the light-emitting element 160 may be connected to the output terminal of the driving transistor DT, and a low-level voltage VSS may be applied to the cathode. Although an organic light-emitting element is employed as the light-emitting element 160 in the example shown in FIG. 2, the present disclosure is not limited thereto. An inorganic light-emitting diode, i.e., an LED may also be used as the light-emitting element 160.

Referring to FIG. 2, the switching transistor SWT is a transistor for transferring the data voltage DATA to a first node N1 corresponding to the gate electrode of the driving transistor DT. The switching transistor SWT may include a drain electrode connected to the data line DL, a gate electrode connected to the gate line GL, and a source electrode connected to the gate electrode of the driving transistor DT. The switching transistor SWT may be turned on by a scan signal SCAN applied from the gate line GL to transfer the data voltage DATA supplied from the data line DL to the first node N1 that is the gate electrode of the driving transistor DT.

Referring to FIG. 2, the driving transistor DT is a transistor for driving the light-emitting element 160 by supplying a driving current to the light-emitting element 160. The driving transistor DT may include a gate electrode associated with the first node N1, a source electrode associated with the second node N2 and working as the output terminal, and a drain electrode associated with the third node N3 and working as the input terminal. The gate electrode of the driving transistor DT may be connected to the switching transistor SWT, the drain electrode may receive a high-level voltage VDD through a high-level voltage line VDDL, and the source electrode may be connected to the anode of the light-emitting element 160.

Referring to FIG. 2, the storage capacitor SC is a capacitor for holding a voltage equal to the data voltage DATA for one frame. One electrode of the storage capacitor SC may be connected to the first node N1, and the other electrode of the storage capacitor SC may be connected to the second node N2.

Incidentally, as the driving time of each sub-pixel SP in the display device 100 increases, the circuit elements such as the driving transistor DT may be degraded. As a result, the characteristic values of the circuit elements such as the driving transistor DT may be changed. The characteristic values of the circuit elements may include the threshold voltage Vth of the driving transistor DT, the mobility a of the driving transistor DT, etc. Such change in the characteristic values of the circuit elements may cause a change in luminance of the respective sub-pixel SP. Therefore, a change in the characteristic values of the circuit elements may be regarded as a change in luminance of the sub-pixel SP.

In addition, the degree of the change in characteristic values of the circuit elements of each of the sub-pixels SP may be different depending on the degree of degradation of the circuit elements. Such difference in the degree of change in the characteristic values between the circuit elements may cause deviations in luminance between the sub-pixels SP. Therefore, deviations in the characteristic values of the circuit elements may be regarded as deviations in luminance of the sub-pixel SP. A change in the characteristic values of the circuit elements, that is, a change in the luminance of the sub-pixel SP and deviations in the characteristic values between the circuit elements, that is, deviations in the luminance between the sub-pixels SP may lower the accuracy of the luminance represented by the sub-pixels SP or may generate defects on the images.

In view of the above, the sub-pixel SP of the display device 100 according to an exemplary aspect of the present disclosure can provide a feature of sensing the characteristic values of the sub-pixel SP, and a feature of compensating for the characteristic values of the sub-pixel SP based on the results of the sensing.

To this end, as shown in FIG. 2, the sub-pixel SP may further include a sensing transistor SET for effectively controlling the voltage status at the source electrode of the driving transistor DT, in addition to the switching transistor SWT, the driving transistor DT, the storage capacitor SC and the light-emitting element 160.

Referring to FIG. 2, the sensing transistor SET is connected between the source electrode of the driving transistor DT and a reference line RL for supplying a reference voltage Vref, and its gate electrode is connected to the gate line GL. Accordingly, the sensing transistor SET may be turned on by a sensing signal SENSE applied through the gate line GL to apply the reference voltage Vref supplied through the reference line RL to the source electrode of the driving transistor DT. In addition, the sensing transistor SET may be utilized as one of voltage sensing paths for the source electrode of the driving transistor DT.

Referring to FIG. 2, the switching transistor SWT and the sensing transistor SET of the sub-pixel SP may share the single gate line GL. That is to say, the switching transistor SWT and the sensing transistor SET may receive the same gate signal applied from the same gate line GL. Although the voltage applied to the gate electrode of the switching transistor SWT is referred to as a scan signal SCAN while the voltage applied to the gate electrode of the sensing transistor SET is referred to as a sensing signal SENSE for convenience of illustration, it is to be understood that the scan signal SCAN and the sensing signal SENSE applied to one sub-pixel SP are the same signal transferred from the same gate line GL. Accordingly, in FIG. 3, the scan signal SCAN and the sensing signal SENSE are defined as gate signals GATE1, GATE2, GATE3 and GATE4.

It should be understood, however, that the present disclosure is not limited thereto. Only the switching transistor SWT may be connected to the gate line GL, and the sensing transistor SET may be connected to a separate sensing line. Accordingly, the scan signal SCAN may be applied to the switching transistor SWT through the gate line GL, and the sensing signal SENSE may be applied to the sensing transistor SET through the sensing line.

Accordingly, the reference voltage Vref is applied to the source electrode of the driving transistor DT through the sensing transistor SET. In addition, the threshold voltage Vth of the driving transistor DT or a voltage for sensing the mobility a of the driving transistor DT is detected through the reference line RL. Then, the data driver DD may compensate for the data voltage DATA according to the detected amount of change in the threshold voltage Vth of the driving transistor DT or the mobility a of the driving transistor DT.

Figure 3:
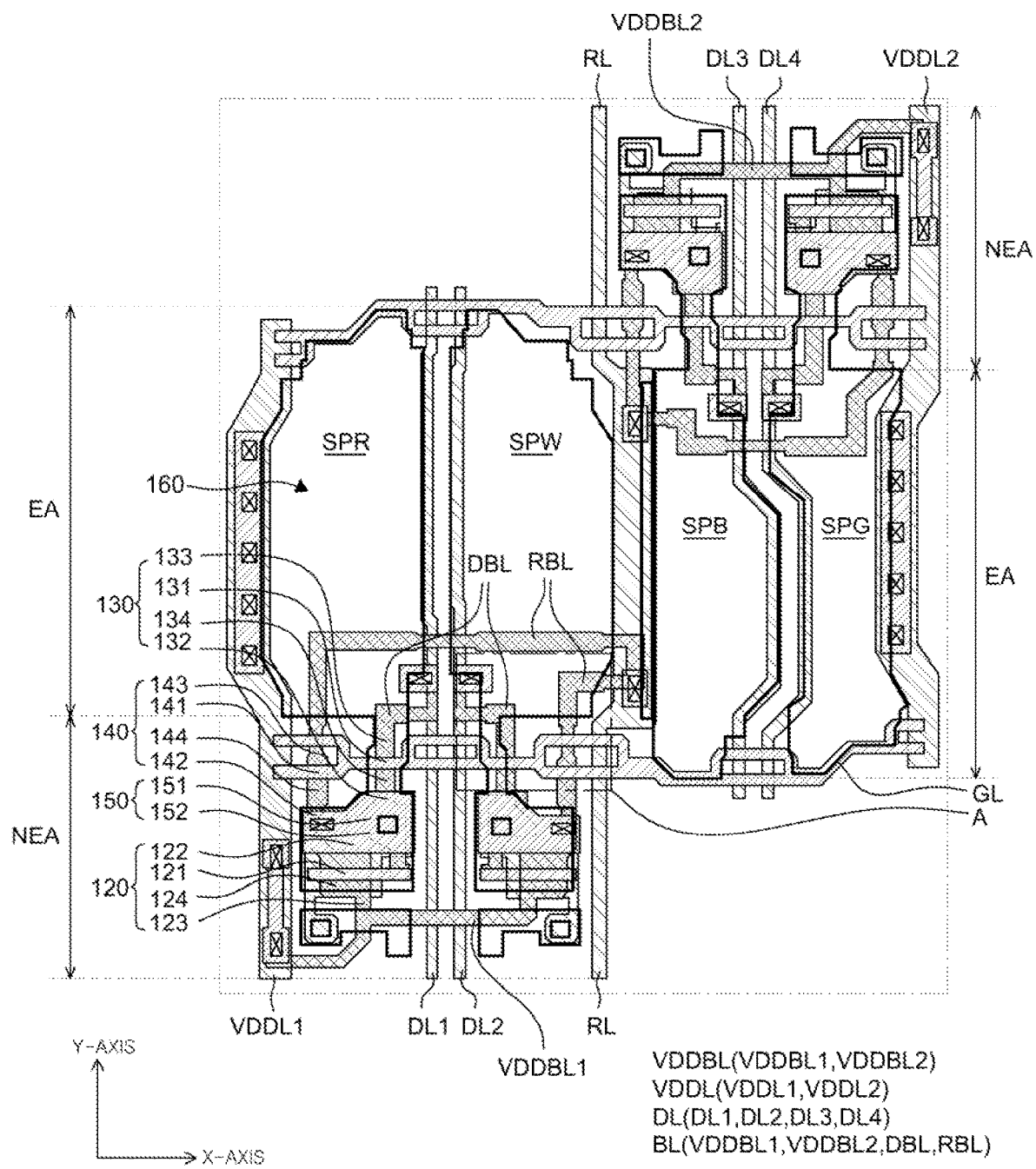
FIG. 3 is an enlarged plan view of a display device according to an exemplary aspect of the present disclosure.
Figure 4:
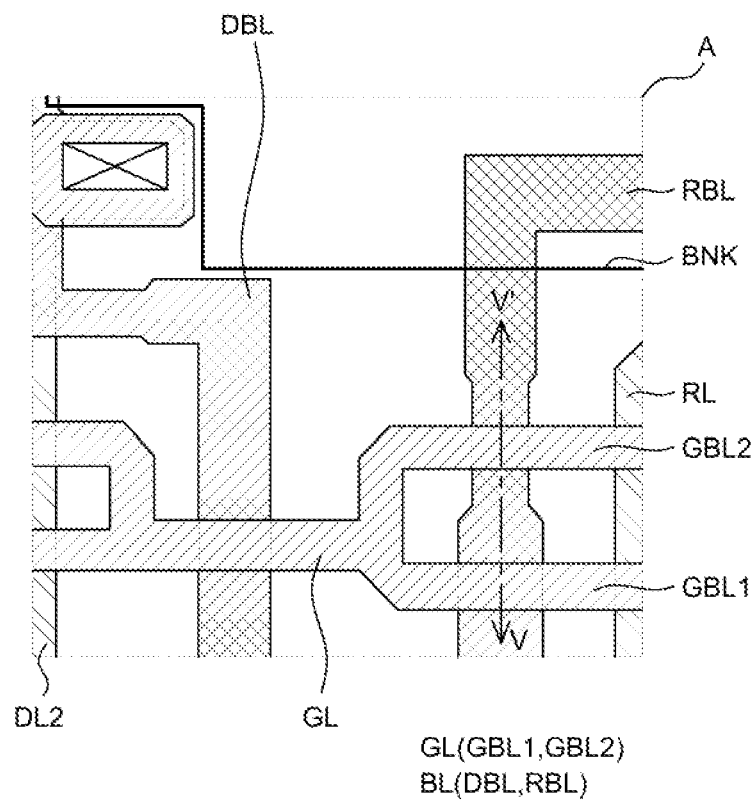
FIG. 4 is an enlarged view of area A of FIG. 3.
Figure 5A:
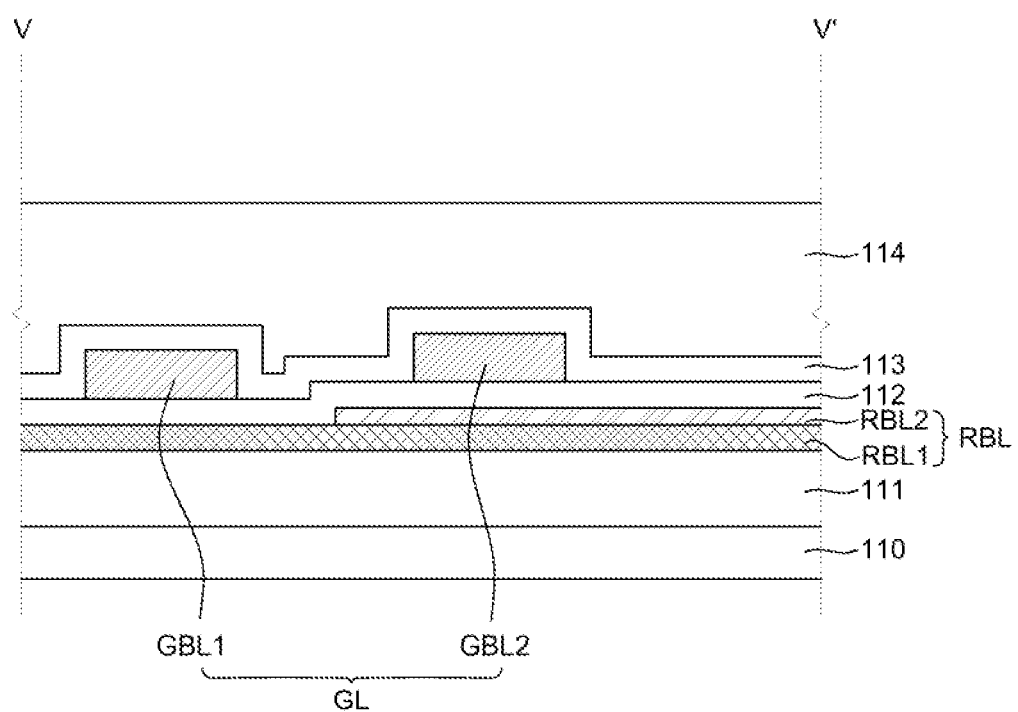
FIGS. 5A and 5B are cross-sectional views taken along line V-V' of FIG. 4.
Figure 5B:
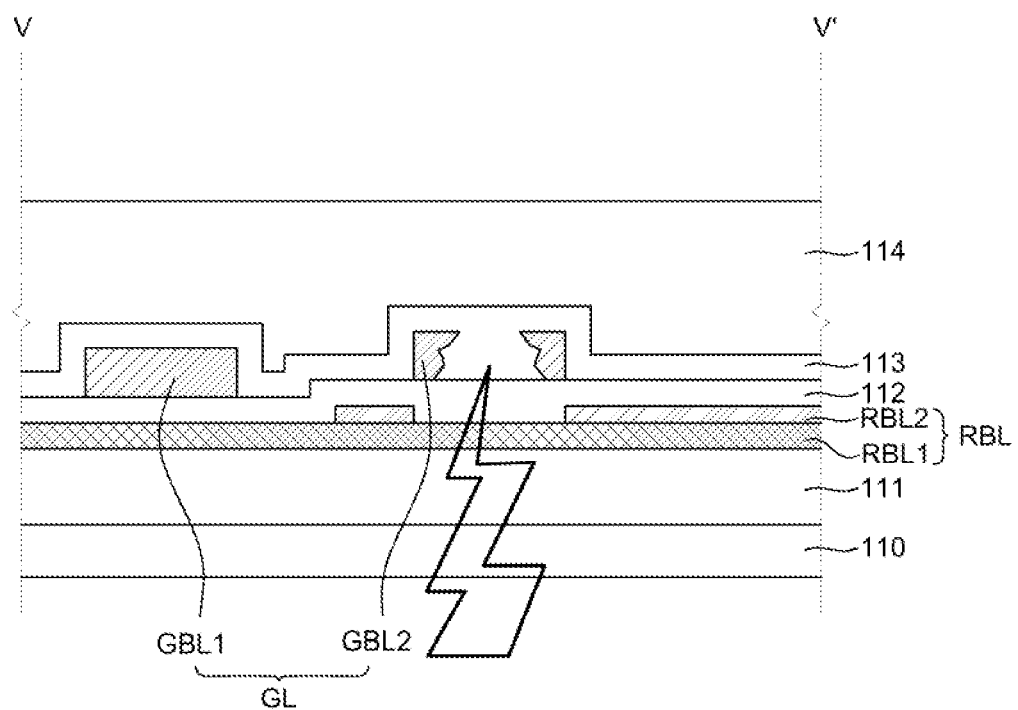

FIG. 3 is an enlarged plan view of a display device according to an exemplary aspect of the present disclosure. FIG. 4 is an enlarged view of area A of FIG. 3. FIGS. 5A and 5B are cross-sectional views taken along line V-V' of FIG. 4.

Referring to FIGS. 3 to 5B, the display device 100 according to the exemplary aspect of the present disclosure includes a substrate 110, gate lines GL, data lines DL, high-level supply voltage lines VDDL, a reference line RL, light-emitting elements 160, first transistors 120, second transistors 130, third transistors 140, storage capacitors 150, color filters, a buffer layer 111, a gate insulator 112, a passivation layer 113, and a planarization layer 114. For convenience of illustration, FIG. 4 shows only the data line DL, the gate line GL, the reference line RL, a data branch line DBL and a reference branch line RBL. For convenience of illustration, FIGS. 5A and 5B shows only the elements between the substrate 110 and the planarization layer 114 among a variety of elements of the display device 100. FIGS. 5A and 5B are cross-sectional views of a white sub-pixel SPW, and the cross-sectional structure of the white sub-pixel SPW may be substantially identical to that of each of the red sub-pixel SPR, the blue sub-pixel SPB and the green sub-pixel SPG.

Initially, referring to FIG. 3, a plurality of sub-pixels SP includes a red sub-pixel SPR, a white sub-pixel SPW, a blue sub-pixel SPB and a green sub-pixel SPG, and each of the sub-pixels SP includes an emission area EA and a non-emission area NEA.

The emission area EA can individually emit light of a color, where the light-emitting elements 160 may be disposed. The emission area EA of the red sub-pixel SPR may be a red emission area emitting red light, the emission area EA of the white sub-pixel SPW may be a white emission area emitting white light, the emission area EA of the blue sub-pixel SPB may be a blue emission area emitting blue light, and the emission area EA of the green sub-pixel SPG may be a green emission area emitting green light.

In the non-emission area NEA, a driving circuit for driving the plurality of light-emitting elements 160 is disposed, and a first transistor 120, a second transistor 130, a third transistor 140 and a storage capacitor 150 may be disposed.

The non-emission areas NEA of the red sub-pixel SPR, the white sub-pixel SPW, the blue sub-pixel SPB and the green sub-pixel SPG may have a generally similar structure. It should be noted that the sub-pixels SP forming one pixel PX share signal lines, and thus different sub-pixels may have different structures. Referring to FIG. 3, the red sub-pixel SPR, the white sub-pixel SPW, the blue sub-pixel SPB and the green sub-pixel SPG share the reference line RL. The red sub-pixel SPR and the white sub-pixel SPW share the first high-level supply voltage line VDDL1, and the blue sub-pixel SPB and the green sub-pixel SPG share the second high-level supply voltage line VDDL2. Accordingly, the red sub-pixel SPR and the white sub-pixel SPW make a pair, and the blue sub-pixel SPB and the green sub-pixel SPG make a pair, so that the pairs may have a symmetric structure.

In addition, in order to optimize the ratio between the areas during the circuit design process, the blue sub-pixel SPB and the green sub-pixel SPG may be inverted with respect to the red sub-pixel SPR and the white sub-pixel SPW in the y-axis direction, as shown in FIG. 3. Specifically, the non-emission area NEA may be disposed lower than the emission area EA in the y-axis direction in the red sub-pixel SPR and the white sub-pixel SPW, whereas the non-emission area NEA may be disposed higher than the emission area EA in the y-axis direction in the blue sub-pixel SPB and the green sub-pixel SPG. It is, however, to be understood that the present disclosure is not limited thereto.

Referring to FIG. 3, a plurality of high-level supply voltage lines VDDL, a plurality of data lines DL, and a reference line RL extended in the column direction (y-axis direction) are disposed between a plurality of sub-pixels SP on the substrate 110. The plurality of high-level supply voltage lines VDDL, the plurality of data lines DL and the reference line RL may be disposed on the same layer on the substrate 110 and may be made of the same material. For example, the plurality of high-level supply voltage lines VDDL, the plurality of data lines DL and the reference line RL may be made of, but is not limited to, a conductive material such as copper (Cu), aluminum (Al), molybdenum (Mo), nickel (Ni), titanium (Ti) and chromium (Cr), or an alloy thereof.

The plurality of high-level supply voltage lines VDDL transmit a supply voltage signal to the plurality of sub-pixels SP, and includes a first high-level supply voltage line VDDL1 and a second high-level supply voltage line VDDL2. Two sub-pixels SP adjacent to each other in the row direction (x-axis direction) may share one of the high-level supply voltage lines VDDL. For example, the first high-level supply voltage line VDDL1 may be disposed on the left side of the red sub-pixel SPR to transmit a supply voltage signal to the first transistor 120 of each of the red sub-pixel SPR and the white sub-pixel SPW. The second high-level supply voltage line VDDL2 may be disposed on the right side of the green sub-pixel SPG to transmit a supply voltage signal to the first transistor 120 of each of the blue sub-pixel SPB and the green sub-pixel SPG.

The plurality of data lines DL transmits a data signal to each of the plurality of sub-pixels SP, and includes a first data line DL1, a second data line DL2, a third data line DL3 and a fourth data line DL4. The first data line DL1 may be disposed between the red sub-pixel SPR and the white sub-pixel SPW, i.e., on the right side of the red sub-pixel SPR, to transmit a data signal to the second transistor 130 of the red sub-pixel SPR. The second data line DL2 may be disposed between the first data line DL1 and the white sub-pixel SPW, i.e., on the left side of the white sub-pixel SPW, to transmit a data signal to the second transistor 130 of the white sub-pixel SPW. The third data line DL3 may be disposed between the blue sub-pixel SPB and the green sub-pixel SPG, i.e., on the right side of the blue sub-pixel SPB, to transmit a data signal to the second transistor 130 of the blue sub-pixel SPB. The fourth data line DL4 may be disposed between the third data line DL3 and the green sub-pixel SPG, i.e., on the left side of the green sub-pixel SPG, to transmit a data signal to the second transistor 130 of the green sub-pixel SPG.

The reference line RL transmits a reference signal to each of the plurality of sub-pixels SP, and may be disposed between the white sub-pixel SPW and the blue sub-pixel SPB. A plurality of sub-pixels SP forming a pixel may share a single reference line RL. The reference line RL may transmit a reference signal to the third transistor 140 of each of the red sub-pixel SPR, the white sub-pixel SPW, the blue sub-pixel SPB and the green sub-pixel SPG.

The buffer layer 111 may be disposed on the plurality of high-level supply voltage line VDDL, the plurality of data lines DL, and the reference line RL. The buffer layer 111 can prevent permeation of moisture or impurities through the substrate 110. The buffer layer 111 may be made up of, but is not limited to, a single layer of silicon oxide (SiOx) or silicon nitride (SiNx) or multiple layers thereof. The buffer layer 111 may be eliminated depending on the type of the substrate 110 or the type of the thin-film transistor, and is not limited to the above-described configuration.

The first transistor 120 is disposed in the non-emission area NEA of each of the red sub-pixel SPR, the white sub-pixel SPW, the blue sub-pixel SPB, and the green sub-pixel SPG. The first transistor 120 includes a first gate electrode 121, a first source electrode 122, a first drain electrode 123 and a first active layer 124. The first transistor 120 electrically connected to the first electrode of the light-emitting element 160 and the high-level supply voltage line VDDL may be a driving transistor DT.

Initially, the first drain electrode 123 may be disposed on the buffer layer 111. The first drain electrode 123 is electrically connected to the plurality of high-level supply voltage lines VDDL. Specifically, the first drain electrode 123 of each of the red sub-pixel SPR and the white sub-pixel SPW may be electrically connected to the first high-level supply voltage line VDDL1 through a contact hole formed in the buffer layer 111, and the first drain electrode 123 of each of the blue sub-pixel SPB and the green sub-pixel SPG may be electrically connected to the second high-level supply voltage line VDDL2 through a contact hole formed in the buffer layer 111. That is to say, the first drain electrode 123 of each of the red sub-pixel SPR and the white sub-pixel SPW may be formed integrally with a first high-level supply voltage branch line VDDBL1 extended from the first high-level supply voltage line VDDL1, and the first drain electrode 123 of each of the blue sub-pixel SPB and the green sub-pixel SPG may be formed integrally with a second high-level supply voltage branch line VDDBL2 extended from the second high-level supply voltage line VDDL2.

A first active layer 124 may be disposed on the buffer layer 111. The first active layer 124 may be made of, but is not limited to, a semiconductor material such as oxide semiconductor, amorphous silicon and polysilicon. For example, when the first active layer 124 is formed of an oxide semiconductor, the first active layer 124 may include a channel region, a source region and a drain region, and the source region and the drain region may be formed by making the material contained in the first active layer 124 conductive. Alternatively, an auxiliary metal layer or a transparent oxide layer may be further disposed on certain regions of the first active layer 124 to form conductive regions. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

The first drain electrode 123 of the red sub-pixel SPR and the first drain electrode 123 of the white sub-pixel SPW may be formed integrally. The first drain electrode 123 of the blue sub-pixel SPB and the first drain electrode 123 of the green sub-pixel SPG may be formed integrally. Specifically, the first drain electrode 123 in the red sub-pixel SPR and the first drain electrode 123 in the white sub-pixel SPW may be formed integrally to share one first high-level supply voltage line VDDL1. For example, the supply voltage signal from the first high-level supply voltage line VDDL1 may be transmitted to the first drain electrode 123 of the white sub-pixel SPW through the first drain electrode 123 of the red sub-pixel SPR. The supply voltage signal from the second high-level supply voltage line VDDL2 may be transmitted to the first drain electrode 123 of the blue sub-pixel SPB through the first drain electrode 123 of the green sub-pixel SPG. It should be understood, however, that the present disclosure is not limited thereto. The first drain electrode 123 in the red sub-pixel SPR and the first drain electrode 123 in the white sub-pixel SPW may be formed separately, and the first drain electrode 123 in the blue sub-pixel SPB and the first drain electrode 123 in the green sub-pixel SPG may also be formed separately.

The first active layer 124 and the first drain electrode 123 of each of the red sub-pixel SPR, the white sub-pixel SPW, the blue sub-pixel SPB and the green sub-pixel SPG may be formed integrally. For example, when a voltage is applied to the first gate electrode 121 in the red sub-pixel SPR, the first drain electrode 123 that is formed integrally with the first active layer 124 and is formed by making the first active layer 124 conductive may transmit a supply voltage signal from the first high-level supply voltage line VDDL1 to the first active layer 124 and the first source electrode 122. The first drain electrode 123 may be defined as being formed integrally with the first high-level supply voltage line VDDL1, but the present disclosure is not limited thereto.

The gate insulator 112 may be disposed on the first active layer 124. The gate insulator 112 may electrically insulate the first gate electrode 121 from the first active layer 124. The gate insulator 112 may be disposed only in line with the first gate electrode 121 and conductive layers formed via the same process using the same material as the first gate electrode 121. For example, the gate insulator 112 may be disposed on the entire surface of the substrate 110, and then may be removed together with the first gate electrode 121 and the conductive layers disposed on the gate insulator 112 when they are patterned. The gate insulator 112 may be made up of, but is not limited to, a single layer of an insulating material, e.g., silicon oxide (SiOx) or silicon nitride (SiNx) or multiple layers thereof.

The first gate electrode 121 may be disposed on the gate insulator 112 so that it overlaps with the first active layer 124 in each of the red sub-pixel SPR, the white sub-pixel SPW, the blue sub-pixel SPB and the green sub-pixel SPG. The first gate electrode 121 may be made of, but is not limited to, a conductive material, e.g., copper (Cu), aluminum (Al), molybdenum (Mo), nickel (Ni), titanium (Ti), chromium (Cr), or an alloy thereof.

The first source electrode 122 spaced apart from the first gate electrode 121 is disposed on the gate insulator 112 in each of the red sub-pixel SPR, the blue sub-pixel SPB and the green sub-pixel SPG. The first source electrode 122 may be electrically connected to the first active layer 124 through a contact hole formed in the gate insulator 112. The first source electrode 122 may be disposed on the same layer as the first gate electrode 121 and may be made of the same material, but the present disclosure is not limited thereto. The first source electrode 122 may be made of, but is not limited to, a conductive material, e.g., copper (Cu), aluminum (Al), molybdenum (Mo), nickel (Ni), titanium (Ti), chromium (Cr), or an alloy thereof.

The second transistor 130 is disposed in the non-emission area NEA of each of the plurality of sub-pixels SP. The second transistor 130 includes a second gate electrode 131, a second source electrode 132, a second drain electrode 133 and a second active layer 134. The second transistor 130 electrically connected to the gate line GL, the data line DL and the first gate electrode 121 of the first transistor 120 may be a switching transistor SWT.

Initially, the second drain electrode 133 may be disposed between the substrate 110 and the buffer layer 111 in each of the plurality of sub-pixels SP. The second drain electrode 133 is electrically connected to one of the plurality of data lines DL. The second drain electrode 133 may be formed integrally with the plurality of data lines DL and may be made of the same material as the plurality of data lines DL. It should be understood, however, that the present disclosure is not limited thereto. As shown in FIG. 3, the second drain electrode 133 may be formed of a plurality of data lines DL and data branch lines DBL connected through contact holes and may be disposed on the same layer as and made of the same material the first drain electrode 123. Specifically, like the first drain electrode 123, the second drain electrode 133 may be formed by making a region of the second active layer 134 conductive.

The second source electrode 132 spaced apart from the second drain electrode 133 is disposed in each of the plurality of sub-pixels SP. The second source electrode 132 may be the same node as the gate electrode 121 of the first transistor 120. The second source electrode 132 may be defined as the same layer as the first gate electrode 121 or as the same layer as the second drain electrode 133. When the second source electrode 132 is the same layer as the first gate electrode 121, the second source electrode 132 may be made of, but is not limited to, a conductive material, for example, copper (Cu), aluminum (Al), molybdenum (Mo), nickel (Ni), titanium (Ti), chromium (Cr) or an alloy thereof. When the second source electrode 132 is the same layer as the second drain electrode 133, the second source electrode 132 may be formed by making a region of the second active layer 134 conductive, like the second drain electrode 133.

The second active layer 134 may be disposed on the buffer layer 111 in each of the plurality of sub-pixels SP. The second active layer 134 may be electrically connected to the second source electrode 132 and the second drain electrode 133. The second active layer 134 may be made of, but is not limited to, a semiconductor material such as oxide semiconductor, amorphous silicon and polysilicon. An auxiliary metal layer or a transparent oxide layer may be further disposed on certain regions of the second active layer 134 to form conductive regions. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

The second gate electrode 131 may be disposed on the gate insulator 112 to overlap the second active layer 134 in each of the plurality of sub-pixels SP. The second gate electrode 131 may be made of, but is not limited to, a conductive material, e.g., copper (Cu), aluminum (Al), molybdenum (Mo), nickel (Ni), titanium (Ti), chromium (Cr), or an alloy thereof.

The second gate electrode 131 may be the gate line GL. That is to say, a part of the gate line GL may work as the second gate electrode 131. The gate line GL may be made of, but is not limited to, a conductive material, e.g., copper (Cu), aluminum (Al), molybdenum (Mo), nickel (Ni), titanium (Ti), chromium (Cr), or an alloy thereof.

The gate line GL transmits a gate signal to each of the plurality of sub-pixels SP, and is extended across the plurality of sub-pixels SP in the row direction. For example, the gate line GL may be extended in the row direction between the non-emission area NEA and the emission area EA of each of the plurality of sub-pixels SP, and may cross the high-level supply voltage lines VDDL, the data lines DL and the reference line RL extended in the column direction. A gate redundancy structure formed in the gate line GL will be described in detail below with reference to FIGS. 4 to 5B.

The third transistor 140 is disposed in the non-emission area NEA of each of the plurality of sub-pixels SP. The third transistor 140 includes a third gate electrode 141, a third source electrode 142, a third drain electrode 143 and a third active layer 144. The third transistor 140 electrically connected to the reference line RL, the gate line GL, and the second capacitor electrode 152 of the storage capacitor 150 may be a sensing transistor SET.

Initially, the third source electrode 142 may be disposed between the substrate 110 and the buffer layer 111 in each of the plurality of sub-pixels SP. The third source electrode 142 may be disposed on the same layer as the plurality of high-level supply voltage lines VDDL, the plurality of data lines DL, and the reference line RL, and may be made of the same material. The third source electrode 142 may be made of, but is not limited to, a conductive material, e.g., copper (Cu), aluminum (Al), molybdenum (Mo), nickel (Ni), titanium (Ti), chromium (Cr), or an alloy thereof.

In addition, the third source electrode 142 may be electrically connected to the second capacitor electrode 152 forming the storage capacitor 150, which will be described later.

The third source electrode 142 may work as a light-blocking layer that blocks light incident on the first active layer 124 of the first transistor 120. For example, if light is irradiated onto the first active layer 124, a leakage current may be generated, thereby reducing the reliability of the first transistor 120. The third source electrode 142 made of a non-transparent conductive material is disposed under the first active layer 124 and the first gate electrode 121, and can block the light incident on the first active layer 124 from below the substrate 110. In this manner, the reliability of the first transistor 120 can be improved.

The third active layer 144 may be disposed on the buffer layer 111 in each of the plurality of sub-pixels SP. The third active layer 144 may be electrically connected to the third source electrode 142 through a contact hole formed in the buffer layer 111. The third active layer 144 may be made of, but is not limited to, a semiconductor material such as oxide semiconductor, amorphous silicon and polysilicon. An auxiliary metal layer or a transparent oxide layer may be further disposed on certain regions of the third active layer 144 to form conductive regions. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

The third gate electrode 141 may be disposed on the gate insulator 112 to overlap the third active layer 144 in each of the plurality of sub-pixels SP. The third gate electrode 141 may be the gate line GL. That is to say, a part of the gate line GL may work as the third gate electrode 141. The third gate electrode 141 may be made of, but is not limited to, a conductive material, e.g., copper (Cu), aluminum (Al), molybdenum (Mo), nickel (Ni), titanium (Ti), chromium (Cr), or an alloy thereof.

The third drain electrode 143 is disposed on the gate insulator 112 in each of the plurality of sub-pixels SP. The third drain electrode 143 may be electrically connected to the third active layer 144 through a contact hole formed in the gate insulator 112. The third drain electrode 143 may be made of a conductive material, e.g., copper (Cu), aluminum (Al), molybdenum (Mo), nickel (Ni), titanium (Ti), chromium (Cr), or an alloy thereof. It should be understood, however, that the present disclosure is not limited thereto. The third drain electrode 143 may be formed of the reference branch line RBL connected to the reference line RL through a contact hole and may be disposed on the same layer and made of the same material as the second drain electrode 133, as shown in FIG. 3.

That is to say, the third drain electrode 143 is electrically connected to the reference line RL. Although the third drain electrode 143 may be formed integrally with the reference line RL and may be made of the same material as the reference line RL, the third drain electrode 143 may be formed of the reference branch line RBL connected to the reference line RL through a contact hole, may be formed on the same layer and may be made of the same material as the first drain electrode 123, as shown in FIG. 3. Specifically, like the second drain electrode 133, the third drain electrode 143 may be formed by making a region of the third active layer 134 conductive.

The storage capacitor 150 is disposed in the non-emission area NEA of each of the red sub-pixel SPR, the white sub-pixel SPW, the blue sub-pixel SPB, and the green sub-pixel SPG. The storage capacitor 150 may store the voltage between the first gate electrode 121 and the first source electrode 122 of the first transistor 120 so that the light-emitting element 160 remains in the same state for one frame. The storage capacitor 150 includes a first capacitor electrode 151 and a second capacitor electrode 152.

The first capacitor electrode 151 is disposed between the substrate 110 and the buffer layer 111 in each of the red sub-pixel SPR, the blue sub-pixel SPB and the green sub-pixel SPG. The first capacitor electrode 151 may be disposed closest to the substrate 110 among the conductive elements disposed on the substrate 110. Accordingly, the distance between the first capacitor electrode 151 and the second electrode is increased so that it is possible to suppress parasitic capacitance that may occur between the first capacitor electrode 151 and the second electrode.

The first capacitor electrode 151 may be formed integrally with the second source electrode 132 to be electrically connected to the second source electrode 132. In addition, the first capacitor electrode 151 may be electrically connected to the first gate electrode 121 through a contact hole formed in the buffer layer 111. That is to say, the second source electrode 132 of the second transistor 130 and the first gate electrode 1211 of the first transistor 120 may be electrically connected through the first capacitor electrode 151. The first capacitor electrode 151 formed integrally with the second source electrode 132 may be made of the same material as the second source electrode 132. As shown in FIG. 3, like the second source electrode 132, the first capacitor electrode 151 may be formed by making a region of the second active layer 134 conductive. Alternatively, when the source electrode 132 is a metal layer, the first capacitor electrode 151 may be made of, but is not limited to, a conductive material, e.g., copper (Cu), aluminum (Al), molybdenum (Mo), nickel (Ni), titanium (Ti), chromium (Cr), or an alloy thereof.

In this instance, the first capacitor electrode 151 is disposed lower than the first gate electrode 121 and the first source electrode 122. The first capacitor electrode 151 is disposed to overlap the first source electrode 122.

A second capacitor electrode 152 is disposed on the gate insulator 112 in each of the red sub-pixel SPR, the blue sub-pixel SPB and the green sub-pixel SPG. The second capacitor electrode 152 may be disposed on the first capacitor electrode 151 so that it overlaps with the first capacitor electrode 151. In this instance, an insulating layer may be disposed between the second capacitor electrode 152 and the first capacitor electrode 151.

The second capacitor electrode 152 can prevent light leakage in the non-emission areas NEA of each of the red sub-pixel SPR, the white sub-pixel SPW, the blue sub-pixel SPB and the green sub-pixel SPG. Specifically, in the emission area EA of each of the red sub-pixel SPR, the blue sub-pixel SPB and the green sub-pixel SPG, color filters 170 associated with the respective pixels are disposed, so that white light emitted from the light-emitting elements 160 may be converted into red, blue, or green. If undesirable light is emitted from the non-emission area NEA of each of the red sub-pixel SPR, the blue sub-pixel SPB and the green sub-pixel SPG, the light emitted from the emission area EA and the light from the non-emission area NEA may be mixed, and thus the color coordinates of each sub-pixel SP may be shifted. In this regard, the second capacitor electrode 152 may be made of a non-transparent conductive material and disposed under the light-emitting elements 160. Accordingly, even if undesirable light is emitted from the circuitry of each of the red sub-pixel SPR, the blue sub-pixel SPB and the green sub-pixel SPG, it is possible to block the light emitted from the circuitry from passing through the substrate 110 by the second capacitor electrode 152. In this manner, it is possible to prevent light leakage from the circuitry, and to improve the color purity in each of the sub-pixels SP.

The second capacitor electrode 152 may be formed integrally with the first source electrode 122 to be electrically connected to the first source electrode 122. A part of the first source electrode 122 that overlaps with the first capacitor electrode 151 may be defined as the second capacitor electrode 152. The second capacitor electrode 152 formed integrally with the first source electrode 122 may be made of the same material as the first source electrode 122, for example, it may be made of a conductive material such as copper (Cu), aluminum (Al), molybdenum (Mo), nickel (Ni), titanium (Ti) and chromium (Cr), or an alloy thereof. It should be understood, however, that the present disclosure is not limited thereto.

In summary, the first capacitor electrode 151 of the storage capacitor 150 may be formed integrally with the second source electrode 132, and may be electrically connected to the first gate electrode 121 of the first transistor 120 and the second source electrode 132 of the second transistor 130. In addition, the second capacitor electrode 152 may be formed integrally with the first source electrode 122, and may be electrically connected to the first source electrode 122 of the first transistor 120 and the third source electrode 142 of the third transistor 140.

Subsequently, the passivation layer 113 may be disposed on the first transistor 120, the second transistor 130, the third transistor 140, the storage capacitor 150, a plurality of high-level supply voltage lines VDDL, a plurality of data lines DL, the reference line RL and the gate line GL. The passivation layer 113 is an insulating layer for protecting the elements under it. For example, the passivation layer 113 may be made up of, but is not limited to, a single layer of silicon oxide (SiOx) or silicon nitride (SiNx) or multiple layers thereof. In some aspects of the present disclosure, the passivation layer 113 may be eliminated.

A plurality of color filters is disposed on the passivation layer 113. Specifically, a plurality of color filters may be disposed between the planarization layer 114 and the passivation layer 113. The plurality of color filters includes a red color filter, a green color filter, and a blue color filter. A red color filter is disposed on the emission area EA of the red sub-pixel SPR, a blue color filter is disposed on the emission area EA of the blue sub-pixel SPB, and a green color filter is disposed on the emission area EA of the green sub-pixel SPG. It should be noted that the plurality of color filters is not disposed on the emission area EA of the white color filter SPW. The area of the color filters is not depicted in FIG. 3 for convenience of illustration.

The planarization layer 114 may be disposed on the passivation layer 113 and the color filters. The planarization layer 114 is an insulating layer that provides a flat surface over the first transistor 120, the second transistor 130, the third transistor 140, the storage capacitor 150, a plurality of high-level supply voltage lines VDDL, a plurality of data lines DL, the reference line RL and the gate line GL disposed on the substrate 110. The planarization layer 114 may be made of an organic material, and may be made up of a single layer or multiple layers of polyimide or photo acryl, for example. It should be understood, however, that the present disclosure is not limited thereto.

The light-emitting element 160 is disposed in each of the plurality of sub-pixels SP. The light-emitting element 160 is disposed on the planarization layer 114 in each of the plurality of sub-pixels SP. The light-emitting element 160 includes a first electrode, an emissive layer, and a second electrode.

The first electrode is disposed on the planarization layer 114 in the emission area EA. Since the first electrode supplies holes to the emissive layer, it is made of a conductive material having a high work function, and may be referred to as an anode. The first electrode may be made of, for example, a transparent conductive material such as indium tin oxide (ITO) and indium zinc oxide (IZO). It should be understood, however, that the present disclosure is not limited thereto.

Incidentally, when the display device 100 according to the exemplary aspect of the present disclosure has a top-emission architecture, a reflective layer made of a metal material having excellent reflection efficiency, for example, aluminum (Al) or silver (Ag), may be added under the first electrode so that the light emitted from the emissive layer is reflected by the first electrode and travels toward the upper side, i.e., toward the second electrode. On the contrary, when the display device 100 has a bottom-emission architecture, the first electrode may be made only of a transparent conductive material. In the following description, it is assumed that the display device 100 has a bottom-emission architecture.

The emissive layer is disposed on the first electrode in the emission area EA and the non-emission area NEA. The emissive layer may be formed as a single layer across the plurality of sub-pixels SP. In other words, the emissive layer of each of the plurality of sub-pixels SP may be connected to one another and formed integrally. The emissive layer may be made up of a single emissive layer or a stack of multiple layers that emit lights of different colors. The emissive layer may further include an organic layer such as a hole injection layer, a hole transport layer, an electron transport layer, and an electron injection layer.

The second electrode is disposed on the emissive layer in the emission area EA and the non-emission area NEA. Since the second electrode supplies electrons to the emissive layer, it is made of a conductive material having a low work function, and may be referred to as a cathode. The second electrode may be formed as a single layer over the plurality of sub-pixels SP. That is to say, the second electrodes of the plurality of sub-pixels SP may be connected to one another and formed integrally. The second electrode may be made of, for example, a transparent conductive material such as indium tin oxide (ITO) and indium zinc oxide (IZO) or a ytterbium (Yb) alloy, and may further include a metal doped layer. It should be understood, however, that the present disclosure is not limited thereto. Incidentally, although not shown in FIGS. 3 to 5, the second electrode of the light-emitting element 160 may be electrically connected to a low-level supply voltage line to receive a low-level supply voltage.

The light-emitting element 160 includes an extension extended from the first electrode toward the non-emission area NEA. The extension may be extended from the first electrode of the emission area EA toward the first source electrode 122 of the non-emission area NEA and may be electrically connected to the first source electrode 122 through a contact hole formed in the planarization layer 114 and the passivation layer 113. Accordingly, the first electrode of the light-emitting element 160 may be electrically connected to the first source electrode 122 of the first transistor 120 which is the second capacitor electrode 152 of the storage capacitor 150 through the extension.

Subsequently, the gate line GL and the reference branch line RBL will be described with reference to FIGS. 3 to 5B.

Initially, the gate line GL disposed in the non-emission area NEA is a line that transmits a gate signal to each of the plurality of sub-pixels SP, and is extended across the plurality of sub-pixels SP in the row direction. Since a scan signal is sequentially supplied to the gate line GL under the control of the timing controller, the gate line GL may also be referred to as a scan line. As shown in FIG. 3, according to the exemplary aspect of the present disclosure, a one-scan line structure in which the second transistor 130 and the third transistor 140 operate on one gate line GL is mainly described. It should be understood, however, that a two-scan line structure with two gate lines GL may be equally employed.

In particular, the gate line GL may use a gate redundancy structure where it crosses a plurality of signal lines. The gate redundancy structure refers to that the gate line GL is branched into two lines only where the gate line GL crosses the plurality of signal lines. The gate redundancy structure may be extended along the gate line GL and may be branched into a first bridge line GBL1 and a second bridge line GBL2 on the upper and lower sides in y-axis direction, respectively.

In addition, the non-emission area NEA may include signal lines that cross the gate line GL and are extended in the y-axis direction. The signal lines crossing the gate line GL may include the first high-level supply voltage line VDDL1, the second high-level supply voltage line VDDL2, a plurality of data lines DL and the reference line RL.

Since the signal lines transmit signals to the plurality of sub-pixels SP, branch lines BL extended from the respective signal lines are required. The branch lines BL may include a first high-level supply voltage line VDDBL1 extended from the first high-level supply voltage line VDDL1, a second high-level supply voltage branch line VDDBL2 extended from the second high-level supply voltage line VDDL2, a data branch line DBL extended from a data line DL, and a reference branch line RBL extended from the reference line RL. The first high-level supply voltage branch line VDDBL1 and the second high-level supply voltage branch line VDDBL2 may be connected to the first high-level supply voltage line VDDL1 and the second high-level supply voltage line VDDL2, respectively, to apply the high-level voltage to the plurality of sub-pixels SP. The data branch line DBL may be connected to the plurality of data lines DL to apply a data voltage to the plurality of sub-pixels SP, and the reference branch line RBL may be connected to the reference line RL to apply a reference voltage to the plurality of sub-pixels SP.

The branch lines BL may be formed integrally with and extended from the respective signal lines electrically connected thereto. In this instance, the branch lines BL are disposed on the same layer and are made of the same material as the signal lines, the branch lines BL may be made of, but is not limited to, a conductive material, such as copper (Cu), aluminum (Al), molybdenum (Mo), nickel (Ni), titanium (Ti), chromium (Cr), or an alloy thereof. It is to be understood that the branch lines BL may be formed on a layer different from that of the signal lines and may be electrically connected thereto through contact holes. In particular, as shown in FIG. 3, the branch lines BL may be formed by making certain regions of the first active layer 124, the second active layer 134 and the third active layer 144 conductive.

That is to say, at least a part of the branch lines BL may include a stack structure in which a semiconductor layer and a transparent oxide layer are stacked on one another. The branch lines BL may be formed only with a semiconductor layer in at least some regions and may be formed as a stack structure of a semiconductor layer and a transparent oxide layer formed on the semiconductor layer at other regions. In this instance, the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

In particular, among the branch lines BL, the reference branch line RBL requires a region extended in x-axis direction in order to transmit a reference voltage to each sub-pixel SP because the reference line RL is disposed between the white sub-pixel SPW and the blue sub-pixel SPB. Specifically, the reference branch line RBL may be extended in the x-axis direction to be connected to the red sub-pixel SPR and the green sub-pixel SPG, and may be bent in y-axis direction to be disposed in an 'L' shape in each pixel. Therefore, if the reference branch line RBL is made of an opaque material, it should be disposed in the non-emission area NEA, and thus the non-emission area NEA may occupy a larger area in the pixel. In contrast, in the display device 100 according to the exemplary aspect of the present disclosure, the branch lines BL may include a stack structure of a semiconductor layer and a transparent oxide layer disposed on the semiconductor layer, the reference branch line RBL may be disposed to pass over the emission area EA. Specifically, the emission area EA may be defined by the bank BNK, and as shown in FIG. 4, a part of the reference branch line RBL may overlap the emission area EA defined by the bank BNK.

However, when a defective pixel is generated, e.g., a line is opened during the process of fabricating the display device 100, a repair process is required for the pixel. The repair process may be carried out by cutting a line of the defective pixel by laser to make it dark. Specifically, the repair process may include irradiating a laser beam onto the first high-level supply voltage branch line VDDBL1, the second high-level supply voltage branch line VDDBL2, the data branch line DBL and the reference voltage branch line RBL, which transmit the high-level voltages, the data voltage and the reference voltage to the plurality of sub-pixels SP, respectively. If the laser is irradiated onto a repair location of a line containing an opaque material, the laser is not transmitted in the repair location and the energy of the laser may be received or reflected, so that the line can be disconnected. However, when the line is made of a transparent material as in the display device 100 according to the exemplary aspect of the present disclosure, the laser in the particular wavelength band used in the repair process cannot be absorbed, and the thus the laser in the particular wavelength band is transmitted as it is. As a result, the repair process cannot proceed.

In this regard, the reference branch line RBL may overlap with bridge lines branching off from a metal layer disposed adjacent to the reference branch line RBL at certain regions. Referring to FIG. 4, the reference branch line RBL may overlap with the first bridge line GBL1 and the second bridge line GBL2 of the gate line GL adjacent to the reference branch line RBL. The gate line GL has a structure in which it is branched into the first bridge line GBL1 and the second bridge line GBL2 so that they cross the reference line RL. In the existing gate redundancy structure, the first bridge line GBL1 and the second bridge line GBL2 of the gate line GL are designed so that they do not overlap with the branch line BL. According to the exemplary aspect of the present disclosure, in contrast, the first bridge line GBL1 and the second bridge line GBL2 may be extended so that the first bridge line GBL1 and the second bridge line GBL2 can pass over the reference branch line RBL.

Referring to FIGS. 4 to 5B, the reference branch line RBL may include only the semiconductor layer RBL1 at some regions, and may include a stack structure in which the semiconductor layer RBL1 and the transparent oxide layer RBL2 are stacked on one another at other regions. In this instance, the reference branch line RBL may include only the semiconductor layer RBL1 where it overlaps with the first bridge line GBL1, and may include a stack structure of the semiconductor layer RBL1 and the transparent oxide layer RBL2 where it overlaps with the second bridge line GBL2. That is to say, the reference branch line RBL may be conductive as it has the stack structure of the semiconductor layer RBL1 and the transparent oxide layer RBL2 from where it is extended from the reference line RL to where it overlaps with the second bridge line GBL2, and may not be conductive as the transparent oxide layer RBL2 is not disposed where it overlaps with the first bridge line GBL1 disposed lower than the second bridge line GBL2 in the y-axis direction.

In addition, the reference branch line RBL has conductivity due to the transparent oxide layer RBL2 where it overlaps with the second bridge line GBL2. The second bridge line GBL2 may be made of copper (Cu), aluminum (Al), molybdenum (Mo), nickel (Ni), titanium (Ti), chromium (Cr), or an alloy thereof, i.e., an opaque metal because it is branched off from the gate line GL. Accordingly, a laser of a particular wavelength band may be received or reflected where the reference branch line RBL overlaps with the extended second bridge line GBL2, so that a repair process may be carried out at that region.

FIG. 5A shows a structure in which the reference branch line RBL overlaps with the first bridge line GBL1 and the second bridge line GBL2 before a repair process is carried out. FIG. 5B shows the structure after the repair process has been carried out. Referring to FIG. 5B, after the repair process by laser has been carried out, the reference branch line RBL may be disconnected together with the second bridge line GBL2 where it includes the stack structure of the semiconductor layer RBL1 and the transparent oxide layer RBL2 and overlaps with the second bridge line GBL2. That is to say, when the laser is irradiated onto the region where the reference branch line RBL and the second bridge line GBL2 overlap each other, the second bridge line GBL2 receives and reflects the energy of the laser, so that the transparent oxide layer RBL2 of the reference branch line RBL may also be disconnected. As a result, the current path via which the reference voltage can be transferred to the sub-pixel is disconnected, and thus the sub-pixel can become a dark spot via the laser repair process.

However, if the repair process is not carried out, the sensing transistor SET receiving the reference voltage from the reference line RL is required, and thus a third transistor 140 should be formed the region of the sub-pixel where the reference branch line RBL and the gate line GL are included. The third transistor 140 includes a third gate electrode 141, a third source electrode 142, a third drain electrode 143 and a third active layer 144. In the display device 100 according to the exemplary aspect of the present disclosure, the reference branch line RBL is formed integrally with the third active layer 144 and includes the transparent oxide layer RBL2 where it overlaps with the second bridge line GBL2, so that the third transistor 140 can be formed with respect to the first bridge line GBL1. That is to say, the reference branch line RBL includes an active layer forming the channel of the sensing transistor SET where it overlaps with the first bridge line GBL1. As a result, the first bridge line GBL1 branching off from the gate line GL and extended to overlap with the reference branch line RBL may work as the third gate electrode 141, the active layer disposed under the first bridge line GBL1 may work as the third active layer 144, and the conductive region including the transparent oxide layer RBL2 under the second bridge line GBL2 may work as the third drain electrode 143.

Accordingly, in the display device 100 according to the exemplary aspect of the present disclosure, the reference branch line RBL is made of a transparent material, and the first bridge line GBL1 and the second bridge line GBL2 of the gate line GL are extended such that they overlap with the reference branch line RBL so that the aperture ratio can be improved and the repair process of the reference branch line RBL can proceed. As a result, the aperture ratio can be increased without any additional metal layer.

Previously, it is known that branch lines extended from signal lines are formed integrally with an active layer, and certain regions of the active layer are made conductive to transmit signal to each sub-pixel. In order to make certain regions of the active layer conductive, the branch lines include a stack structure of a semiconductor layer and an auxiliary metal layer disposed on the semiconductor layer, for example. In such a structure of the semiconductor layer and the auxiliary metal layer, the auxiliary metal layer can receive or reflect a laser of a particular wavelength band during the repair process for the branch lines, so that the line can be disconnected. Accordingly, there is no difficulty in proceeding with the repair process.

Recently, in order to reduce the area of the non-emission area as much as possible, there have been attempts to form the branch lines of a transparent material. For example, the branch lines may include a semiconductor layer and a transparent oxide layer disposed on the semiconductor layer, similarly to the display device 100 according to the exemplary aspect. Since the transparent oxide layer is made of a transparent conductive material such as indium zinc oxide (IZO), when the branch lines include a transparent oxide layer to become conductive, the entire branch lines have transparency, and thus the aperture ratio is not reduced even though the branch lines pass through the emission area. However, since the branch lines including the transparent oxide layer transmit the laser for conducting the repair process for the signal lines, an additional metal layer is required. In view of the above, recent display devices have employed a structure in which an additional metal layer disposed on the same layer and formed of the same material as the gate metal layer is disposed at some regions of the branch lines. Unfortunately, such structure has a problem in that the open area is reduced because it includes contact holes for electrically connecting the additional metal layer with the branch lines, and it is necessary to provide a space from the nearby patterns.

Under the circumferences, in the display device 100 according to the exemplary aspect of the present disclosure, instead of disposing an additional metal layer on the reference branch line RBL in order to perform a repair process, the bridge lines branching off from the metal layer adjacent to the reference branch line RBL overlaps with the reference branch line RBL, so that the repair process can be stably carried out while achieving high a aperture ratio.

Specifically, as the reference branch line RBL includes a stack structure of the semiconductor layer RBL1 and the transparent oxide layer RBL2 stacked on the semiconductor layer RBL1, the aperture ratio is not reduced even though it is connected to the reference line RL and extended in the x-axis direction to pass through the emission area EA. Accordingly, the reference branch line RBL is not necessarily disposed in the non-emission area NEA, and thus a greater freedom of design can be realized. In addition, a higher aperture ratio can be achieved than the existing reference branch line structures.

In addition, as described above, the additional metal layer required for the repair process as the reference branch line RBL is made of a transparent material can be replaced by extending the first bridge line GBL1 and the second bridge line GBL2 branching off from the adjacent gate line GL, so that the aperture ratio can be increased by the area occupied by the additional metal layer. That is to say, the display device 100 according to the exemplary aspect of the present disclosure can increase the aperture ratio and can conduct the repair process for the reference line RL stably.

Figure 6:
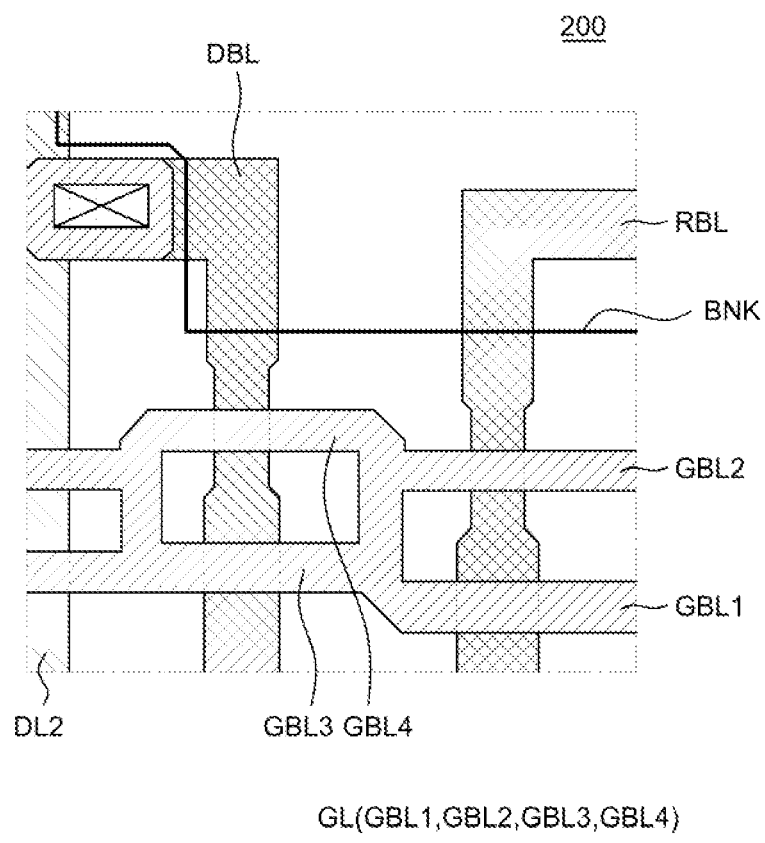
FIG. 6 is an enlarged view of a display device according to another exemplary aspect of the present disclosure.

FIG. 6 is an enlarged view of a display device according to another exemplary aspect of the present disclosure. FIG. 6 shows only a gate line GL, a data line DL, a reference branch line RBL, a data branch line DBL and a bank BNK for convenience of illustration. A display device 200 according to the exemplary aspect of FIG. 6 is substantially identical to the display device 100 according to the exemplary aspect of FIGS. 1 to 5B except for the gate line GL; and, therefore, the redundant descriptions will be omitted.

As described above, the gate line GL is disposed in the non-emission area NEA and transmit a gate signal to each of the plurality of sub-pixels SP, and is extended across the plurality of sub-pixels SP in the row direction.

The gate lines GL may use a gate redundancy structure where it crosses a plurality of signal lines. The gate redundancy structure refers to that the gate line GL is branched into two lines only where the gate line GL crosses the plurality of signal lines. The gate redundancy structure may be extended along the gate line GL and may be branched into a first bridge line GBL1 and a second bridge line GBL2 on the upper and lower sides in y-axis direction, respectively. It should be noted that the display device 200 according to another exemplary aspect may further include a third bridge line GBL3 and a fourth bridge line GBL4. The third bridge line GBL3 may branch off from the gate line GL to connect between the adjacent first bridge lines GBL1, and the fourth bridge line GBL4 may branch off from the gate line GL to connect between the adjacent second bridge lines GBL2. Accordingly, the gate line GL may have a chain shape including a plurality of holes arranged along the x-axis direction.

In addition, the non-emission area NEA may include signal lines that cross the gate line GL and are extended in the y-axis direction. The signal lines need branch lines BL extended from the respective signal lines in order to transmit signals to the plurality of sub-pixels. The branch lines may include a first high-level supply voltage line VDDBL1, a second high-level supply voltage line VDDBL2, a data branch line DBL, and a reference branch line RBL. Such branch lines may be formed integrally from the signal lines electrically connected thereto, or may be formed on a different layer from the signal lines and connected thereto through contact holes, like the display device 200 according to the exemplary aspect of the present disclosure. As described above, at least some regions of the branch lines may include a stack structure of the semiconductor layer and the transparent oxide layer.

In particular, among the branch lines BL, the data branch line DBL requires regions extended in x-axis direction in order to transmit a data voltage to each sub-pixel SP because the plurality of data lines DL is disposed between the red sub-pixel SPR and the white sub-pixel SPW, and between the blue sub-pixel SPB and the green sub-pixel SPG. Specifically, the data branch line DBL may be extended in the x-axis direction to be connected to each sub-pixel SP, and may be bent in y-axis direction to be disposed in an 'L' shape in each pixel. Therefore, if the data branch line DBL is made of an opaque material, it should be disposed in the non-emission area NEA, and thus the non-emission area NEA may occupy a larger area in the pixel. In contrast, in the display device 200 according to another exemplary aspect of the present disclosure, the branch lines BL may include a stack structure of a semiconductor layer and a transparent oxide layer disposed on the semiconductor layer, the data branch line DBL may be disposed to pass over the emission area EA. Specifically, the emission area EA may be defined by the bank BNK, and as shown in FIG. 6, a part of the data branch line DBL may overlap the emission area EA defined by the bank BNK.

However, when the data branch line DBL is made of a transparent material as in the display device 200 according to another exemplary aspect of the present disclosure, the laser in the particular wavelength band used in the repair process cannot be absorbed, and the thus the laser in the particular wavelength band is transmitted as it is. As a result, the repair process cannot proceed.

In this regard, the data branch line DBL may overlap with bridge lines branching off from a metal layer disposed adjacent to the data branch line DBL at certain regions. Referring to FIG. 6, the data branch line DBL may overlap with the third bridge line GBL3 and the fourth bridge line GBL4 of the gate line GL adjacent to the data branch line DBL. The third bridge line GBL3 and the fourth bridge line GBL4 may branch off from it to connect between the first bridge lines GBL1 and between the second bridge lines GBL2, respectively. In the existing structure, the gate line GL are designed so that it is branched into the first bridge line GBL1 and the second bridge line GBL2 only where it crosses signal lines. In contrast, according to this exemplary aspect, the gate line GL may further include the third bridge line GBL3 and the fourth bridge line GBL4 so that the third bridge line GBL3 and the fourth bridge line GBL4 can pass over the data branch line DBL.

As described above, the data branch line DBL may include only a semiconductor layer at some regions and may include a stack structure in which the semiconductor layer and a transparent oxide layer are stacked on one another at other regions. In this instance, the data branch line DBL may include only the semiconductor layer where it overlaps with the third bridge line GBL3, and may include the stack structure of the semiconductor layer and the transparent oxide layer where it overlaps with the fourth bridge line GBL4. That is to say, the data branch line DBL may be conductive as it has the stack structure of the semiconductor layer and the transparent oxide layer from where it is extended from the data line DL to where it overlaps with the fourth bridge line GBL4, and may not be conductive as the transparent oxide layer is not disposed where it overlaps with the third bridge line GBL3 disposed lower than the fourth bridge line GBL4 in the y-axis direction.

In addition, the data branch line DBL has conductivity due to the transparent oxide layer where it overlaps with the fourth bridge line GBL4, and the fourth bridge line GBL4 may be made of copper (Cu), aluminum (Al), molybdenum (Mo), nickel (Ni), titanium (Ti), chromium (Cr), or an alloy thereof, i.e., an opaque metal because it is branched from the gate line GL. Accordingly, a laser of a particular wavelength band may be received or reflected where the data branch line DBL overlaps with the additional fourth bridge line GBL4, so that a repair process may be carried out at that region.

After the repair process by laser has been carried out, the data branch line DBL may be disconnected together with the fourth bridge line GBL4 where it includes the stack structure of the semiconductor layer and the transparent oxide layer and overlaps with the fourth bridge line GBL4. That is to say, when the laser is irradiated onto the region where the data branch line DBL and the fourth bridge line GBL4 overlap each other, the fourth bridge line GBL4 receives and reflects the energy of the laser, so that the transparent oxide layer of the data branch line DBL may also be disconnected. As a result, the current path via which the data voltage can be transferred to the sub-pixel is disconnected, and thus the sub-pixel can become a dark spot via the laser repair process.

However, if the repair process is not carried out, the switching transistor SWT receiving the data voltage from the data line DL is required, and thus a second transistor 130 should be formed the region of the sub-pixel where the reference branch line RBL and the gate line GL are included. The second transistor 130 includes a second gate electrode 131, a second source electrode 132, a second drain electrode 133 and a second active layer 134. In the display device 200 according to another exemplary aspect of the present disclosure, the data branch line DBL is formed integrally with the second active layer 134 and includes the transparent oxide layer where it overlaps with the fourth bridge line GBL4, so that the second transistor 130 can be formed with respect to the third bridge line GBL3. That is to say, the data branch line DBL includes an active layer forming the channel of the switching transistor SWT where it overlaps with the third bridge line GBL3. As a result, the third bridge line GBL3 branching off from the gate line GL and overlapping the data branch line DBL may work as the second gate electrode 131, the active layer disposed under the third bridge line GBL3 may work as the second active layer 134, and the conductive region including the transparent oxide layer under the fourth bridge line GBL4 may work as the second drain electrode 133.

Accordingly, in the display device 200 according to the exemplary aspect of the present disclosure, the data branch line DBL is made of a transparent material, and the third bridge line GBL3 and the fourth bridge line GBL4 of the gate line GL are extended such that they overlap with the data branch line DBL so that the aperture ratio can be improved and the repair process of the data branch line DBL can proceed. As a result, the aperture ratio can be increased without any additional metal layer.

Specifically, as the data branch line DBL includes a stack structure of the semiconductor layer and the transparent oxide layer stacked on the semiconductor layer, the aperture ratio is not reduced even though it is connected to the data line DL and extended in the x-axis direction to pass through the emission area EA. Accordingly, the data branch line DBL is not necessarily disposed in the non-emission area NEA, and thus a greater freedom of design can be realized. In addition, a higher aperture ratio can be achieved than the existing data branch line structures.

In addition, as described above, the additional metal layer required for the repair process as the data branch line DBL is made of a transparent material can be replaced by extending the third bridge line GBL3 and the fourth bridge line GBL4 branching off from the adjacent gate line GL, so that the aperture ratio can be increased by the area occupied by the additional metal layer. That is to say, the display device 200 according to the exemplary aspect of the present disclosure can increase the aperture ratio and can conduct the repair process for the data line DL stably.

Figure 7:
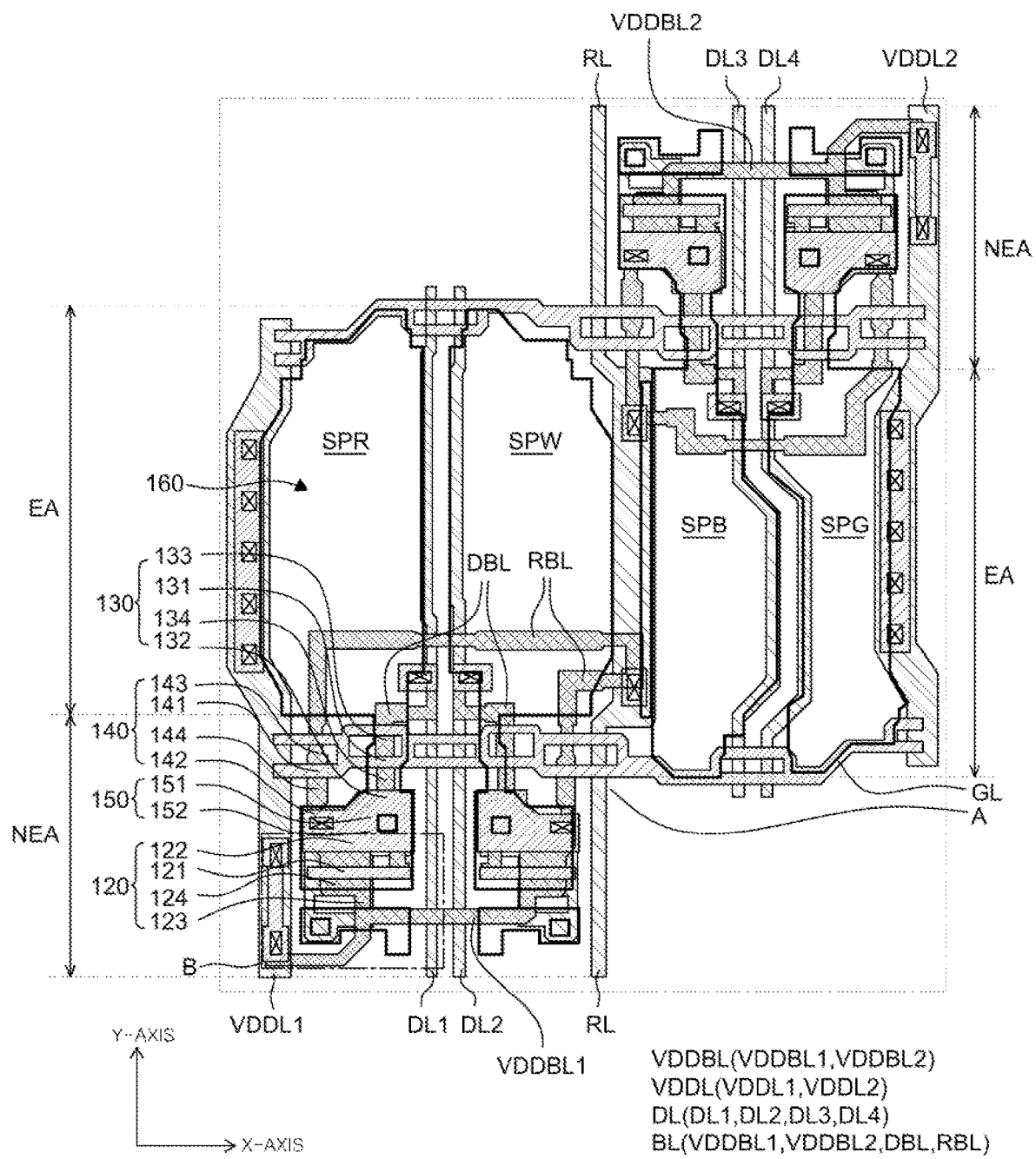
FIG. 7 is an enlarged plan view of a display device according to yet another exemplary aspect of the present disclosure.
Figure 8:
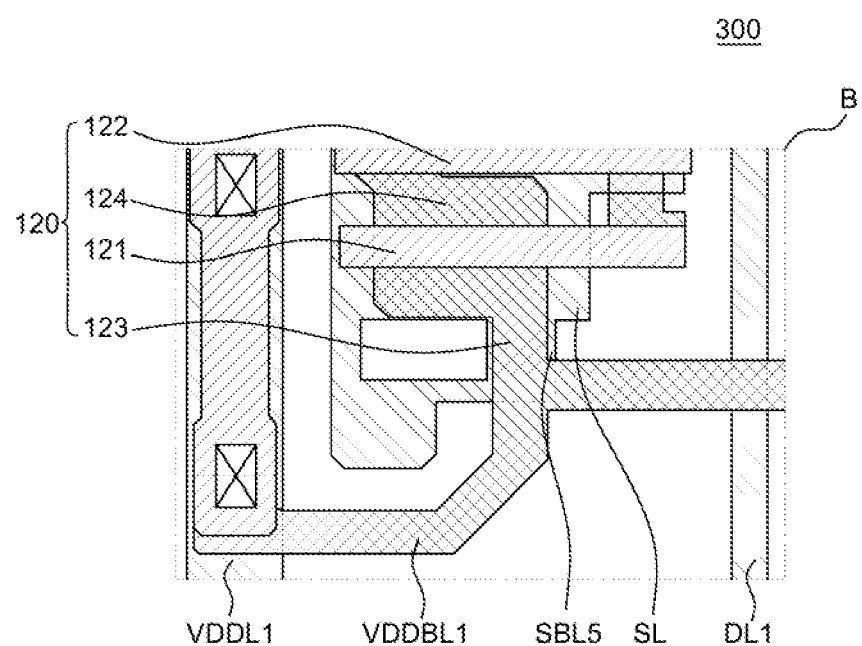
FIG. 8 is an enlarged view of area B of FIG. 7.

FIG. 7 is an enlarged plan view of a display device according to yet another exemplary aspect of the present disclosure. FIG. 8 is an enlarged view of area B of FIG. 7. FIG. 8 shows only a first high-level supply voltage line VDDL1, a first high-level supply voltage branch line VDDBL1, a first data line DL1 and a light-blocking layer SL among a variety of elements of a display device 300 for convenience of illustration. The display device 300 according to the exemplary aspect of FIGS. 7 and 8 is substantially identical to the display device 200 according to the exemplary aspect of FIG. 6 except for the shape of the light-blocking layer SL; and, therefore, the redundant descriptions will be omitted.

As mentioned earlier, the third source electrode 142 may work as a light-blocking layer that blocks light incident on the first active layer 124 of the first transistor 120. The third source electrode 142 may be disposed on the same layer and may be made of the same material as the first high-level supply voltage line VDDL1, the second high-level supply voltage line VDDL2, the plurality of data lines DL and the reference line RL disposed on the substrate 110. That is to say, the third source electrode 142 made of a non-transparent conductive material is disposed under the first active layer 124 and the first gate electrode 121, and can block the light incident on the first active layer 124 from below the substrate 110. In this manner, the reliability of the first transistor 120 can be improved. Accordingly, the third source electrode 142 will be referred to as the light-blocking layer SL in the following description.

In addition, the non-emission area NEA may include signal lines that cross the gate line GL and are extended in the y-axis direction. The signal lines need branch lines BL extended from the respective signal lines in order to transmit signals to the plurality of sub-pixels. The branch lines may include a first high-level supply voltage line VDDBL1, a second high-level supply voltage line VDDBL2, a data branch line DBL, and a reference branch line RBL. Such branch lines may be formed integrally from the signal lines electrically connected thereto, or may be formed on a different layer from the signal lines and connected thereto through contact holes, like the display device 200 according to the exemplary aspect of the present disclosure. As described above, at least some regions of the branch lines may include a stack structure of the semiconductor layer and the transparent oxide layer.

In particular, among the branch lines BL, the first high-level supply voltage branch line VDDBL1 and the second high-level supply voltage branch line VDDBL2 require regions extended in x-axis direction in order to transmit a high-level voltage to each sub-pixel SP because the first high-level supply voltage line VDDL1 and the second high-level supply voltage line VDDL2 are disposed on the both sides of the red sub-pixel SPR and the green sub-pixel SPG, respectively. Specifically, the high-level supply voltage branch line VDDBL may be extended in the x-axis direction to be connected to each sub-pixel SP, and may be bent in y-axis direction to be disposed in an 'L' shape in each pixel. Therefore, if the high-level supply voltage branch lines VDDBL are made of an opaque material, they should be disposed in the non-emission area NEA, and thus the non-emission area NEA may occupy a larger area in the pixel. In contrast, in the display device 300 according to yet another exemplary aspect of the present disclosure, the branch lines BL may include a stack structure of a semiconductor layer and a transparent oxide layer disposed on the semiconductor layer, the high-level supply voltage branch line VDDBL may be designed more freely in terms of the margin between patterns.

However, when the high-level supply voltage branch line VDDBL is made of a transparent material as in the display device 300 according to yet another exemplary aspect of the present disclosure, the laser in the particular wavelength band used in the repair process cannot be absorbed, and the thus the laser in the particular wavelength band is transmitted as it is. As a result, the repair process cannot proceed.

In this regard, the high-level supply voltage branch lines VDDBL may overlap with bridge lines branching off from a metal layer disposed adjacent to the high-level supply voltage branch lines VDDBL at certain regions. Referring to FIGS. 7 and 8, the high-level supply voltage branch lines VDDBL may overlap with a fifth bridge line SBL5 of the light-blocking layer SL adjacent to the high-level supply voltage branch lines VDDBL. In this instance, the fifth bridge line SBL5 may branch off from the light-blocking layer SL where it cross the high-level supply voltage branch lines VDDBL.

The high-level supply voltage branch lines VDDBL may include only a semiconductor layer at some regions and may include a stack structure in which the semiconductor layer and a transparent oxide layer are stacked on one another at other regions. The high-level supply voltage branch lines VDDBL may include the stack structure in which the semiconductor layer and the transparent oxide layer are stacked on one another where they overlap with the fifth bridge line SBL5. The high-level supply voltage branch lines VDDBL may be conductive as it has the stack structure of the semiconductor layer and the transparent oxide layer from where they are extended from the high-level supply voltage lines VDDL to where they overlap with the fifth bridge line SBL5

In addition, the high-level supply voltage branch lines VDDBL has conductivity due to the transparent oxide layer where it overlaps with the fifth bridge line SBL5, and the fifth bridge line SBL5 may be made of copper (Cu), aluminum (Al), molybdenum (Mo), nickel (Ni), titanium (Ti), chromium (Cr), or an alloy thereof, i.e., an opaque metal because it is branched from the light-blocking layer SL. Accordingly, a laser of a particular wavelength band may be received or reflected where the high-level supply voltage branch lines VDDBL overlap with the additional fifth bridge line SBL5, so that a repair process may be carried out at that region.

After the repair process by laser has been carried out, the high-level supply voltage branch lines VDDBL may be disconnected together with the fifth bridge line SBL5 where they include the stack structure of the semiconductor layer and the transparent oxide layer and overlap with the fifth bridge line SBL5. That is to say, when the laser is irradiated onto the region where the high-level supply voltage branch lines VDDBL and the fifth bridge line SBL5 overlap each other, the fifth bridge line SBL5 receives and reflects the energy of the laser, so that the transparent oxide layer of the high-level supply voltage branch lines VDDBL may also be disconnected. As a result, the current path via which the high-level supply voltage can be transferred to the sub-pixel is disconnected, and thus the sub-pixel can become a dark spot via the laser repair process.

Accordingly, in the display device 300 according to the exemplary aspect of the present disclosure, the high-level supply voltage branch lines VDDBL are made of a transparent material, and the fifth bridge line SBL5 of the light-blocking line SL overlaps with the high-level supply voltage branch line VDDBL so that the aperture ratio can be improved and the repair process of the high-level supply voltage branch line DBL can proceed. As a result, the aperture ratio can be increased without any additional metal layer.

Specifically, as the high-level supply voltage branch lines VDDBL include the stack structure of the semiconductor layer and the transparent oxide layer stacked on the semiconductor layer, the aperture ratio is not reduced even though they are connected to the high-level supply voltage lines VDDL and extended in the x-axis direction to pass through the emission area EA. Accordingly, the high-level supply voltage branch lines VDDBL are not necessarily disposed in the non-emission area NEA, and thus a greater freedom of design can be realized. In addition, a higher aperture ratio can be achieved than the existing high-level supply voltage branch line structures.

In addition, as described above, the additional metal layer required for the repair process as the high-level supply voltage branch lines VDDBL are made of a transparent material can be replaced by the fifth bridge line SBL5 branching off from the adjacent light-blocking layer SL, so that the aperture ratio can be increased by the area occupied by the additional metal layer. That is to say, the display device 300 according to yet another exemplary aspect of the present disclosure can increase the aperture ratio and can conduct the repair process for the high-level supply voltage lines VDDL stably.

The exemplary aspects of the present disclosure can also be described as follows:

According to an aspect of the present disclosure, there is provided a display device. The display device includes a substrate having a plurality of sub-pixels defined thereon, each of the plurality of sub-pixels including an emission area and a non-emission area. The display device further includes at least one gate line disposed in the non-emission area and extended in one direction. The display device further includes at least one signal line disposed in the non-emission area and crossing the at least one gate line. The display device further includes at least one branch line connected to the at least one signal line. The display device further includes at least one bridge line branching off from a metal layer disposed adjacent to the at least one branch line. The at least one branch line overlaps with the at least one bridge line.

At least a region of the at least one branch line may include a stack structure of a semiconductor layer and a transparent oxide layer.

At least a part of the at least one branch line may overlap with the emission area of each of the sub-pixels.

The region of the at least one branch line including the stack structure may be disconnected together with the at least one bridge line where it overlaps with the at least one bridge line.

The at least one branch line may be disconnected by a repair laser.

The at least one signal line may include: at least one high-level supply voltage line disposed in the non-emission area; at least one data line disposed in the non-emission area; and at least one reference line disposed in the non-emission area.

The metal layer may be the at least one gate line. The at least one branch line may include at least one reference branch line connected to the at least one reference line for applying a reference voltage to the plurality of sub-pixels. The at least one gate line may include a first bridge line and a second bridge line branching off therefrom where they cross the at least one gate line. The at least one reference branch line may at least partially overlap with the first bridge line and the second bridge line.

The at least one reference branch line may include only a semiconductor layer where it overlaps with the first bridge line, and may include a stack structure of the semiconductor layer and a transparent oxide layer disposed on the semiconductor layer where it overlaps with the second bridge line.

The at least one reference branch line may include an active layer forming a channel of a sensing transistor where it overlaps with the first bridge line.

The at least one branch line may include at least one data branch line connected to the at least one data line for applying a data voltage to the plurality of sub-pixels. The at least one gate line may further include a third bridge line connecting between adjacent first bridge lines and a fourth bridge line connecting between adjacent second bridge lines. The at least one data branch line may at least partially overlap with the third bridge line and the fourth bridge line.

The at least one data branch line may include only a semiconductor layer where it overlaps with the third bridge line, and may include a stack structure of the semiconductor layer and a transparent oxide layer disposed on the semiconductor layer where it overlaps with the fourth bridge line.

The at least one data branch line may include an active layer forming a channel of a switching transistor where it overlaps with the third bridge line.

The display device may further include a light-blocking layer disposed on a same layer with the at least one high-level supply voltage line. The metal layer may be the light-blocking layer. The at least one branch line may include at least one high-level supply voltage branch line connected to the at least one high-level supply voltage line to apply a high-level supply voltage to the plurality of sub-pixels. The light-blocking layer may include a fifth bridge line overlapping with the at least one high-level supply voltage line.

The at least one high-level supply voltage line may include a stack structure of a semiconductor layer and a transparent oxide layer where it overlaps with the fifth bridge line.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate having a plurality of sub-pixels defined thereon, each of the plurality of sub-pixels including an emission area and a non-emission area;
   at least one gate line disposed in the non-emission area and extended in one direction;
   at least one signal line disposed in the non-emission area and crossing the at least one gate line;
   at least one branch line connected to the at least one signal line; and
   at least one bridge line branching off from a metal layer adjacent to the at least one branch line,
   wherein the at least one branch line overlaps with the at least one bridge line, and
   wherein the at least one branch line includes at least a region having a stack structure of a semiconductor layer and a transparent oxide layer.

2. The display device of claim 1, wherein the at least one branch line has at least a part overlapping with the emission area of each of the sub-pixels.

3. The display device of claim 1, wherein the region of the at least one branch line including the stack structure is disconnected with the at least one bridge line where the region of the at least one branch line overlaps with the at least one bridge line.

4. The display device of claim 3, wherein the at least one branch line is disconnected by a repair laser.

5. The display device of claim 1, wherein the at least one signal line includes:
   at least one high-level supply voltage line disposed in the non-emission area;
   at least one data line disposed in the non-emission area; and
   at least one reference line disposed in the non-emission area.

6. The display device of claim 5, wherein the metal layer is the at least one gate line,
   wherein the at least one branch line includes at least one reference branch line connected to the at least one reference line for applying a reference voltage to the plurality of sub-pixels,
   wherein the at least one gate line includes a first bridge line and a second bridge line branching off therefrom where they cross the at least one signal line, and
   wherein the at least one reference branch line at least partially overlaps with the first bridge line and the second bridge line.

7. The display device of claim 6, wherein the at least one reference branch line includes only a semiconductor layer where the at least one reference branch line overlaps with the first bridge line, and includes a stack structure of the semiconductor layer and a transparent oxide layer disposed on the semiconductor layer where the at least one reference branch line overlaps with the second bridge line.

8. The display device of claim 7, wherein the at least one reference branch line includes an active layer forming a channel of a sensing transistor where the at least one reference branch line overlaps with the first bridge line.

9. The display device of claim 6, wherein the at least one branch line includes at least one data branch line connected to the at least one data line for applying a data voltage to the plurality of sub-pixels,
   wherein the at least one gate line further includes a third bridge line connecting between adjacent first bridge lines and a fourth bridge line connecting between adjacent second bridge lines, and
   wherein the at least one data branch line at least partially overlaps with the third bridge line and the fourth bridge line.

10. The display device of claim 9, wherein the at least one data branch line includes only a semiconductor layer where the at least one data branch line overlaps with the third bridge line, and includes a stack structure of the semiconductor layer and a transparent oxide layer disposed on the semiconductor layer where the at least one data branch line overlaps with the fourth bridge line.

11. The display device of claim 10, wherein the at least one data branch line includes an active layer forming a channel of a switching transistor where the at least one data branch line overlaps with the third bridge line.

12. The display device of claim 5, further comprising a light-blocking layer disposed on a same layer with the at least one high-level supply voltage line,
   wherein the metal layer is the light-blocking layer,
   wherein the at least one branch line includes at least one high-level supply voltage branch line connected to the at least one high-level supply voltage line to apply a high-level supply voltage to the plurality of sub-pixels, and
   wherein the light-blocking layer includes a fifth bridge line overlapping with the at least one high-level supply voltage line.

13. The display device of claim 12, wherein the at least one high-level supply voltage line includes a stack structure of a semiconductor layer and a transparent oxide layer where the at least one high-level supply voltage line overlaps with the fifth bridge line.

* * * * *